(12) United States Patent
Boyd et al.

(10) Patent No.: US 10,535,980 B2
(45) Date of Patent: Jan. 14, 2020

(54) ARCHITECTURE FOR COMPACT COLD ATOM CLOCKS

(71) Applicant: AOSense, Inc., Sunnyvale, CA (US)

(72) Inventors: Martin M. Boyd, Sunnyvale, CA (US); Adam T. Black, Annandale, VA (US); Thang Q. Tran, San Jose, CA (US); Matthew D. Swallows, Santa Clara, CA (US); Brian R. Patton, San Francisco, CA (US); Miao Zhu, San Jose, CA (US); Thomas H. Loftus, Arvada, CO (US); Mark A. Kasevich, Palo Alto, CA (US)

(73) Assignee: AOSense, Inc., Sunnyvale, CA (US)

( * ) Notice: Subject to any disclaimer, the term of this patent is extended or adjusted under 35 U.S.C. 154(b) by 8 days.

(21) Appl. No.: 15/967,409

(22) Filed: Apr. 30, 2018

(65) Prior Publication Data

US 2018/0321641 A1    Nov. 8, 2018

Related U.S. Application Data

(60) Provisional application No. 62/492,872, filed on May 1, 2017, provisional application No. 62/492,874, filed
(Continued)

(51) Int. Cl.
*H01S 5/0687* (2006.01)
*G04F 5/14* (2006.01)
(Continued)

(52) U.S. Cl.
CPC .............. *H01S 5/0687* (2013.01); *G04F 5/14* (2013.01); *H01S 3/0085* (2013.01); *H01S 3/08086* (2013.01); *H01S 3/10* (2013.01); *H01S 3/105* (2013.01); *H01S 3/10092* (2013.01); *H01S 3/13* (2013.01); *H01S 3/1305* (2013.01); *H01S 5/14* (2013.01); *H01S 5/142* (2013.01); *H03L 7/26* (2013.01); *H05H 3/02* (2013.01);
(Continued)

(58) Field of Classification Search
CPC ........................................................ H04F 5/14
USPC ................................................... 331/3, 94.1
See application file for complete search history.

(56) References Cited

U.S. PATENT DOCUMENTS

| 6,303,928 B1 | 10/2001 | Buell | |
| 8,526,000 B1 * | 9/2013 | Schober | G02B 27/00 356/432 |

(Continued)

*Primary Examiner* — Joseph Chang
(74) *Attorney, Agent, or Firm* — Van Pelt, Yi & James LLP

(57) ABSTRACT

An atomic oscillator device includes an atomic oscillator, a controlled oscillator, a resonance controller, and a cold-atom clock output. The atomic oscillator comprises a two-dimensional optical cooling region (2D OCR) for providing a source of atoms and a three-dimensional optical cooling region (3D OCR) for cooling and/or trapping the atoms emitted by the 2D OCR. The atomic oscillator comprises a microwave cavity surrounding the 3D OCR for exciting an atomic resonance. The controlled oscillator produces an output frequency. The resonance controller is for steering the output frequency of the controlled oscillator based on the output frequency and the atomic resonance as measured using an atomic resonance measurement. The cold-atom clock output is configured as being the output frequency of the controlled oscillator.

23 Claims, 9 Drawing Sheets

Related U.S. Application Data on May 1, 2017, provisional application No. 62/492,876, filed on May 1, 2017.

(51) Int. Cl.

| | |
|---|---|
| *H05H 3/02* | (2006.01) |
| *H03L 7/26* | (2006.01) |
| *H01S 3/00* | (2006.01) |
| *H01S 3/08* | (2006.01) |
| *H01S 3/10* | (2006.01) |
| *H01S 3/105* | (2006.01) |
| *H01S 3/13* | (2006.01) |
| *H01S 5/14* | (2006.01) |
| *H01S 5/00* | (2006.01) |
| *H01S 5/022* | (2006.01) |
| *H01S 5/12* | (2006.01) |
| *H01S 5/125* | (2006.01) |
| *H01S 5/40* | (2006.01) |

(52) U.S. Cl.
CPC ......... *H01S 5/0085* (2013.01); *H01S 5/02284* (2013.01); *H01S 5/12* (2013.01); *H01S 5/125* (2013.01); *H01S 5/146* (2013.01); *H01S 5/4012* (2013.01)

(56) References Cited

U.S. PATENT DOCUMENTS

| | | |
|---|---|---|
| 8,921,764 B2 | 12/2014 | Loftus |
| 9,117,563 B2 | 8/2015 | Hughes |
| 2009/0212204 A1* | 8/2009 | McBride .................. H05H 3/02 250/251 |
| 2017/0359888 A1 | 12/2017 | Imhof |

* cited by examiner

ARCHITECTURE FOR COMPACT COLD ATOM CLOCKS

CROSS REFERENCE TO OTHER APPLICATIONS

This application claims priority to U.S. Provisional Patent Application No. 62/492,872 entitled ARCHITECTURE FOR COMPACT COLD ATOM CLOCKS filed May 1, 2017 which is incorporated herein by reference for all purposes. This application also claims priority to U.S. Provisional Patent Application No. 62/492,874 entitled LASER SYSTEM FOR ATOMIC CLOCKS AND SENSORS filed May 1, 2017 which is incorporated herein by reference for all purposes. This application also claims priority to U.S. Provisional Patent Application No. 62/492,876 entitled INTEGRATED OPTICAL DETECTION FOR ATOMIC CLOCKS AND SENSORS filed May 1, 2017 which is incorporated herein by reference for all purposes.

This invention was made with Government support under Contract # D14PC00136 AND D15PC00053 awarded by DARPA. The Government has certain rights in the invention.

BACKGROUND OF THE INVENTION

Clock stability and precision are fundamental to the performance of many applications including global positioning systems (GPS), advanced communications systems, and synthetic aperture radar. However, cost, complexity, clock size, and the state of current technology prevent advanced low-noise clocks from being used in these and many other applications. High-stability clocks can improve GPS performance and system integrity by reducing noise and extending the time duration between clock corrections. The use of portable high-performance clocks to distribute and decentralize precision timekeeping can help eliminate single point of failure weaknesses and ensure the integrity of communications and data storage transactions—even in GPS-denied environments. Advanced communication and synthetic aperture radar techniques can benefit from the low-phase-noise, low-drift microwave signals provided by atomic clocks. However, many of these applications are critically dependent on achieving high performance by maximizing signal-to-noise ratio (SNR) while minimizing size, weight, and power. A significant performance gap remains between atomic clocks developed in research laboratories and those that can be deployed into mobile environments.

BRIEF DESCRIPTION OF THE DRAWINGS

Various embodiments of the invention are disclosed in the following detailed description and the accompanying drawings.

DETAILED DESCRIPTION

Figure 1:
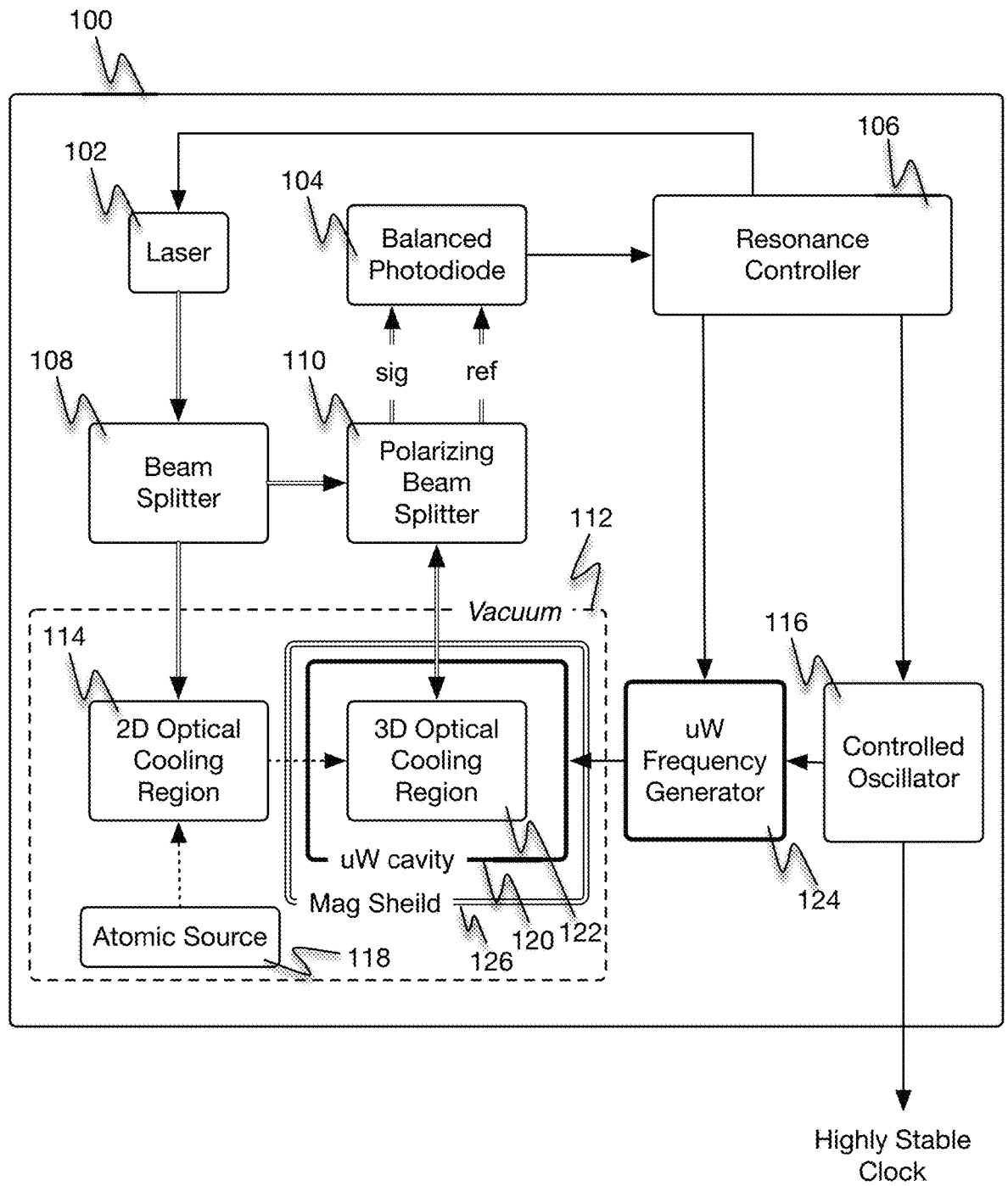
FIG. 1 is a block diagram illustrating an embodiment of an architecture for compact cold atom clocks.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

An atomic oscillator device for an atomic frequency standard is disclosed. The atomic oscillator device comprises an atomic oscillator, a controlled oscillator, a resonance controller, and a cold-atom clock output. The atomic oscillator comprises a two-dimensional optical cooling region (2D OCR) for providing a source of atoms and a three-dimensional optical cooling region (3D OCR) for cooling and/or trapping the atoms emitted by the 2D OCR. The atomic oscillator comprises a microwave cavity surrounding the 3D OCR for exciting an atomic resonance. The controlled oscillator produces an output frequency. The resonance controller is for steering the output frequency of the controlled oscillator based on the output frequency and the atomic resonance as measured using an atomic resonance measurement. The cold-atom clock output is configured as being the output frequency of the controlled oscillator.

Atomic frequency standards can be separated into two broad categories: vapor-cell atomic clocks and laser-cooled atomic clocks. In the former category, the atomic ensemble is enclosed in a vapor cell (often with a buffer gas to inhibit collisions with the cell walls), and the kinetic temperature of the atoms is the same as that of the surrounding cell. In laser-cooled atomic clocks, optical beams are used to slow the atoms in one or more dimensions, such that the resulting kinetic distribution is described by a low temperature; in this case, buffer gases are generally omitted. Frequency standards based on laser-cooled atoms tend to be free of many sources of inaccuracy and drift which affect vapor-cell atomic clocks—namely, drifts due to temperature and pressure variations within the buffer-gas cell. In both types of clock, it is desirable to enclose the atomic ensemble within a microwave cavity and/or magnetic shields in order to provide homogeneous excitation of a microwave resonance or to shield the atoms from undesirable environmental perturbations. In both types of clock, optical state preparation yields a non-equilibrium population imbalance within the atomic sample prior to excitation of an atomic resonance; evolution of the atomic populations according to this resonance serves as the basis for a frequency (equivalently, time) measurement. Any element with transitions that are addressable by laser cooling techniques may be used for the atomic vapor, with typical choices including appropriate isotopes of alkali atoms (cesium, rubidium, etc.) or alkaline earth atoms (strontium, calcium, etc.) or any other appropriate atoms. In some embodiments, $^{87}$Rb (rubidium) atoms are preferred, and a microwave transition at 6.835 GHz is used as the clock transition.

An improved architecture for an atomic frequency standard based upon laser-cooled atoms is disclosed. This architecture is designed to minimize systematic errors and sources of long-term clock drift, and it is based upon simple components amenable to miniaturization and low-power operation. In this architecture, a two-dimensional optical cooling region (2D OCR) serves as a source of laser-cooled atoms for a three-dimensional optical cooling region (3D OCR) within a microwave cavity. Excitation of the hyperfine resonance within the resulting cold-atom cloud provides an atomic reference to stabilize a controlled oscillator. Separation of the initial atom cooling region (the 2D OCR) from the microwave spectroscopy region (the cavity) allows the microwave transition to be unaffected by the large optical and magnetic fields required for atom cooling, resulting in improved accuracy. With appropriate design choices, compact microwave frequency standards can bridge the gap to mobile compact clock sources, resulting in low size, weight, and power devices that improve performance by utilizing laser-cooled atoms.

Laser-cooled atoms represent an ideal physical system for time and frequency measurements. In fact, the internationally accepted definition of the second is presently defined by the ground-state hyperfine splitting frequency of cesium. The "fountain clocks" which provide this accurate time base rely on a cloud of laser-cooled $^{133}$Cs atoms launched vertically through a microwave cavity. Under the influence of gravity, the atom cloud falls back through the cavity, permitting the two-pulse (microwave) Ramsey sequence used for measurement of the hyperfine resonance frequency. Typical pulse separation times are on the order of 1 second in this configuration. Such long interrogation times permit very precise measurement of the hyperfine frequency, but at the expense of a large apparatus with high sensitivity to shifts in orientation. A more compact and portable atomic frequency standard can be created by laser-cooling the atoms directly within the microwave cavity and performing a short Ramsey interrogation sequence, during which time the atoms fall only a very short distance. The present disclosure describes a clock architecture based upon this concept.

In some embodiments, a loop-gap resonator (LGR) microwave cavity is used to excite the atomic resonance. Travelling-wave microwave fields, such as those produced by microwave horns or simple antennas, have position-dependent phase variations which can produce systematic shifts of the atomic clock as the device is accelerated or reoriented within Earth's gravity. Use of a resonant microwave cavity mitigates these effects. Atom fountain clocks typically rely on cylindrical microwave resonance cavities operating in the TE011 mode. LGR cavities can achieve the same resonance frequencies while being much smaller than cylindrical cavities. In an idealized resonant cavity, the interrogating field comprises a pure standing wave in which the excitation is free of first-order Doppler shifts. In practice, small travelling wave components are inevitably present, leading to residual Doppler shifts. The result is a spatially dependent microwave phase, often referred to as a distributed cavity phase (DCP) shift of the clock resonance frequency that depends upon the spatial distribution of atoms within the cavity. Because the atoms fall under the influence of gravity, a non-uniform phase within the cavity can lead to orientation dependence of the clock frequency. In the simple case where the phase varies linearly during the interrogation sequence, the frequency shift resulting from the DCP shift is proportional to the phase shift $\Delta\varphi$ over the interrogation time, T, given by $\Delta\upsilon=\Delta\varphi/2\pi T$. Particular attention must be paid to the phase homogeneity of the microwave cavity. In some embodiments, the LGR cavity has multiple electrodes and is driven by multiple microwave feeds to improve homogeneity of the microwave field phase and/or amplitude. The LGR resonance frequency can be set by the number, spacing, and thickness of the multiple microwave electrodes and fine-tuned by adjustment of the thickness of the cylinder end caps.

In some embodiments, the optics that permit 3D optical cooling/trapping are incorporated inside the microwave cavity. Introducing additional materials inside the cavity shifts the cavity resonance, but this may be compensated through a combination of numerical modeling and experimental adjustment. When appropriate materials are selected, low phase variation inside the cavity can be maintained. In some embodiments, the 3D optical cooling beams are generated by an optical racetrack that directs a single input beam along a triaxial path and retroreflects the cooling light back along the input axis. In some embodiments, the inner diameter of the resonator is 20 mm, and the linear phase shift over a 2 mm radius spherical region inside the cavity can be constrained to below 0.9 mrad to keep the clock shift within the target stability for applications requiring $10^{-12}$ stability, 20 ms interrogation time, and arbitrary orientation.

A microwave cavity surrounds the 3D OCR for exciting an atomic resonance and a multi-layer magnetic shield surrounds the microwave cavity for separating the 3D optical cooling region from the strong magnetic fields of the 2D optical cooling region. In some embodiments, the 2D OCR, the 3D OCR, and the microwave cavity are in vacuum. In some embodiments, microwave cavity is surrounded by magnetic shielding, also in vacuum. In some embodiments, the 2D OCR, 3D OCR, microwave cavity, and magnetic shields surrounding the cavity are all in vacuum, resulting in improved immunity to environmental perturbations such as temperature changes, dust, or acoustical noise.

In some embodiments, 3D OCR comprises a three-dimensional magneto-optical trap (3D MOT). In some embodiments, the 3D OCR comprises a three-dimensional optical molasses (3D OM) rather than a magneto-optical trap (3D MOT). A 3D OM is advantageous because it does not require large magnetic field gradients, which would need to be applied for atom loading and then switched off for the microwave interrogation sequence. Since precise control of the magnetic field is required for clock stability, magnetic shields are typically used to isolate the atoms from external field perturbations. Interrupted or time-varying 3D MOT gradient fields can produce eddy currents in the microwave cavity or the magnetic shields, and may also magnetize the shields, resulting in large and unpredictable gradients within the cavity. Using a 3D OM with static bias field mitigates these issues. The 3D OM architecture produces a larger atom cloud with lower overall atom density than is produced by a 3D MOT. The lower atom density also contributes to improved clock stability by reducing the influence of collisional shifts.

While it would be possible to load a 3D OCR from an alkali vapor within the microwave cavity, there are advantages to using a separate 2D OCR to source the atoms. Background vapor atoms reduce contrast of the desired atom signal by contributing to the final fluorescence or absorption signal after microwave excitation; they can also affect the cold-atom hyperfine frequency through collisional shifts or inhibit loading rates of the 3D OCR. Background vapor can be mitigated by keeping the bulk of the atomic vapor in a 2D OCR, and directing laser-cooled atoms from the 2D OCR toward the 3D OCR, with differential pumping between the 2D and 3D regions. In some embodiments, 2D OCR comprises a two-dimensional magneto-optical trap (2D MOT). Permanent magnets can be used for the 2D MOT magnetic gradients. Compact 2D MOTs can deliver a typical atomic flux of $\sim 10^9$/s, allowing high signal-to-noise ratio (SNR) with ms-scale atom loading times. In some embodiments, 2D OCR comprises a two-dimensional optical molasses (2D OM), which generally reduces atom flux but eliminates the static magnetic fields of the MOT.

In some embodiments, optical absorption of a laser beam is used to measure the atom state populations at the end of the microwave interrogation sequence, and this detection beam is sent along the same optical racetrack used for 3D cooling. In some embodiments, the detection light enters the racetrack via a polarizing beamsplitter (PBS) and passes through the atom cloud six times with polarization controlled by optical waveplates to form a 3D MOT or 3D OM, ultimately exiting along the same axis by which it entered, and is separated from the inbound beam by the PBS. Using optical absorption, rather than fluorescence, simplifies the detection scheme and presents many advantages for a compact atomic frequency standard. Fluorescence detection is plagued by high signal background due to light scattered off optical surfaces. Maximizing the captured fluorescence and minimizing detection of scattered input light tend to be competing goals. In the absorption detection scheme, the multiple passes through the cold-atom cloud enhance optical absorption, resulting in a macroscopic absorption signal commensurate with high SNR. This measurement scheme also requires fewer apertures within the microwave cavity and magnetic shielding than are needed for fluorescence detection, simplifying the mechanics and improving clock stability. Finally, optical absorption of a beam sent through the racetrack permits atoms to be detected with roughly equal efficiency regardless of their direction of motion during the clock sequence, whereas fluorescence detection efficiency can be strongly influenced by atom motion (thereby introducing a mechanism for clock orientation shifts). In some embodiments, sensitivity to laser intensity noise may be mitigated by using a dual balanced photodiode circuit to reject common mode intensity noise between the atom signal path and a reference beam. In some embodiments, laser frequency modulation can be applied to allow detection away from DC, reducing sensitivity to amplitude noise, and reducing the requirements on intensity stability such that a low bandwidth servo is sufficient for stabilization. In various embodiments, frequency modulation can be achieved by methods such as direct laser modulation, an electro-optic modulator, or an acousto-optic modulator.

Using the same optical assembly for 3D atom cooling and absorptive detection results in a simplified laser system and optical layout. In some embodiments, only a single laser system is used to generate all beams. This includes the 2D and 3D cooling beams, as well as the detection beam. An example clock sequence begins with atom cooling using intense 2D and 3D beams that are red-detuned from a cycling transition. The beams are turned off during the microwave interrogation sequence, and then tuned on resonance with weak intensity for detection of absorption within the optical racetrack. Since the processes of atom cooling/trapping, polarization-gradient cooling, optical pumping, and resonant detection all happen at different times within the clock sequence, a common laser system can be used for all steps. In some embodiments, a single laser beam is delivered to the vacuum chamber either by free space or fiber optics, simplifying and reducing the size of the optical beam delivery components. In some embodiments, the 2D OCR beam is separated from the 3D OCR beam by a series of fixed-ratio beamsplitters, resulting in a non-uniform elongated beam sent to the 2D OCR. In some embodiments, only a beamsplitter and a mirror must be added to the implementation of the atom trapping and cooling system to facilitate absorption detection. The 3D MOT or 3D OM polarizations can be used for absorption detection without modification.

In some embodiments, the laser cooling and clock sequence will operate at a relatively high data rate, ~20 Hz, reducing the displacement of the atoms due to gravity during the pulse sequence and enabling a very compact form factor. The high data rate and large atom numbers enable clock stability approaching laboratory systems but in a form factor suitable for portable applications. Moreover, the rapid data rate from the atoms enables significant relaxation of the performance requirements of the crystal oscillator used as a controlled oscillator compared to other approaches. State-of-the-art ultra-stable oscillators can be avoided, enabling low size, weight and power and reduced system cost. Atoms may be recaptured in the 3D OCR at the end of each cycle, increasing the steady-state atom number.

The atomic oscillator device includes a controlled oscillator that produces a highly accurate output frequency using a resonance controller. The resonance controller steers the output frequency of the controlled oscillator based on the output frequency and the atomic resonance as measured using an optical atomic resonance measurement. In some embodiments, the resonance controller is used to control a microwave generator. In some embodiments, the resonance controller is used to control a laser for a temporal sequence including state preparation, atom cooling, and measurement.

FIG. 1 is a block diagram illustrating an embodiment of an architecture for compact cold atom clocks. In the example shown, light beam from laser 102 is split via beam splitter 108 and polarizing beam splitter 110 to divert light to 2D optical cooling region (2D OCR) 114, 3D optical cooling region (3D OCR) 122, and balanced photodiode 104 (reference light). Light returning from 3D OCR 122 (signal) has its polarization rotated 90° with respect to the inbound light and passes through polarizing beam splitter 110 again to be detected by balanced photodiode 104. Balanced photodiode 104 and associated electronics measure the signal while rejecting common mode noise between the signal and reference due to intensity variations. Components within dashed box 112 are maintained under high vacuum. For example, 2D OCR 114, 3D OCR 122, microwave cavity 120, and magnetic shield 126 surrounding microwave cavity 120 are all in vacuum, resulting in improved immunity to environmental perturbations such as temperature changes, dust, or acoustical noise.

In some embodiments, laser 102 utilizes an atomic lock reference that keeps the laser tuned on or near the atomic absorption wavelength. For example, because lasers emit light over a narrow range of wavelengths and atoms absorb light over a similarly narrow range of wavelengths, without active control of the laser wavelength, the laser output will drift away from the atomic absorption wavelength over a rather short timescale. In some embodiments, the laser's atomic lock reference is a separate alkali cell containing the same atoms as the atomic source 118. Measuring the alkali atom's interaction with laser 102 produces an error signal for wavelength stabilization of laser 102. In some embodiments, laser 102 comprises a two-tone laser system with agile detuning and independent control of cooling and re-pump light intensity.

In some embodiments, atomic source 118 produces atomic vapor for 2D OCR 114 using any element with transitions that are addressable by laser cooling techniques. For example, atomic source 118 uses appropriate isotopes of alkali atoms (cesium, rubidium, etc.) or alkaline earth atoms (strontium, calcium, etc.) or any other appropriate atoms. In some embodiments, $^{87}$Rb (rubidium) atoms are used as a source, and a microwave transition at 6.835 GHz is used for the atomic clock transition frequency.

In some embodiments, three-dimensional optical cooling region (3D OCR) 122 is enclosed within microwave cavity 120 in order to provide homogeneous excitation of a microwave resonance. For example, excitation of the hyperfine resonance within the resulting cold-atom cloud provides an atomic reference to stabilize a controlled oscillator. Separation of the initial atom cooling region 2D OCR 114 from the spectroscopy region in microwave cavity 120 allows the microwave transition to be unaffected by the large optical and magnetic fields required for atom cooling, resulting in improved accuracy.

In some embodiments, magnetic shield 126 comprises a multi-layer magnetic shield that surrounds microwave cavity 120. For example, magnetic shield 126 separates 3D OCR 122 from the strong magnetic fields of 2D OCR 114 as well as shields the atoms from undesirable environmental perturbations.

Resonance controller 106 receives input from balanced photodetector 104 and controls laser 102, microwave (uW) frequency generator 124, and controlled oscillator 116. For example, the absorption signal from balanced photodetector 104 contains information about the atomic state distribution in the atom cloud within 3D OCR 122. In turn, the atomic state distribution reflects the degree to which uW frequency generator 124 is in resonance with a transition frequency of the atom cloud and is used by the resonance controller to match the frequency of uW frequency generator 124 to the atomic state transition frequency. When resonance controller 106 determines that the frequency of uW frequency generator 124 is matched to the atomic state transition frequency, it synchronizes the frequency of controlled oscillator 116 to a fixed proportion of the frequency of uW frequency generator 124. In some embodiments, resonance controller 106 outputs a digital control signal for a digital to analog converter (DAC) which then outputs an analog voltage to control controlled oscillator 116. In some embodiments, controlled oscillator 116 is a voltage-controlled crystal oscillator (VCXO). In some embodiments, controlled oscillator 116 is digitally controlled and receives a digital control signal from resonance controller 106.

Resonance controller 106 implements a cyclic temporal laser control sequence necessary to cool the atoms, prepare them into a known state, and detect them after microwave interrogation. The optimal laser tuning is different for each distinct step in the control sequence. During a single cycle of the laser control sequence, the laser wavelength is adjusted by controlled increments in order to accomplish cooling, state preparation, and measurement. The temporal laser control sequence occurs once per cycle and is distinct from the much slower feedback loop which steers controlled oscillator 116 based upon atom measurements in multiple successive laser control cycles. Controlled oscillator 116 outputs a highly stable clock.

Figure 2:
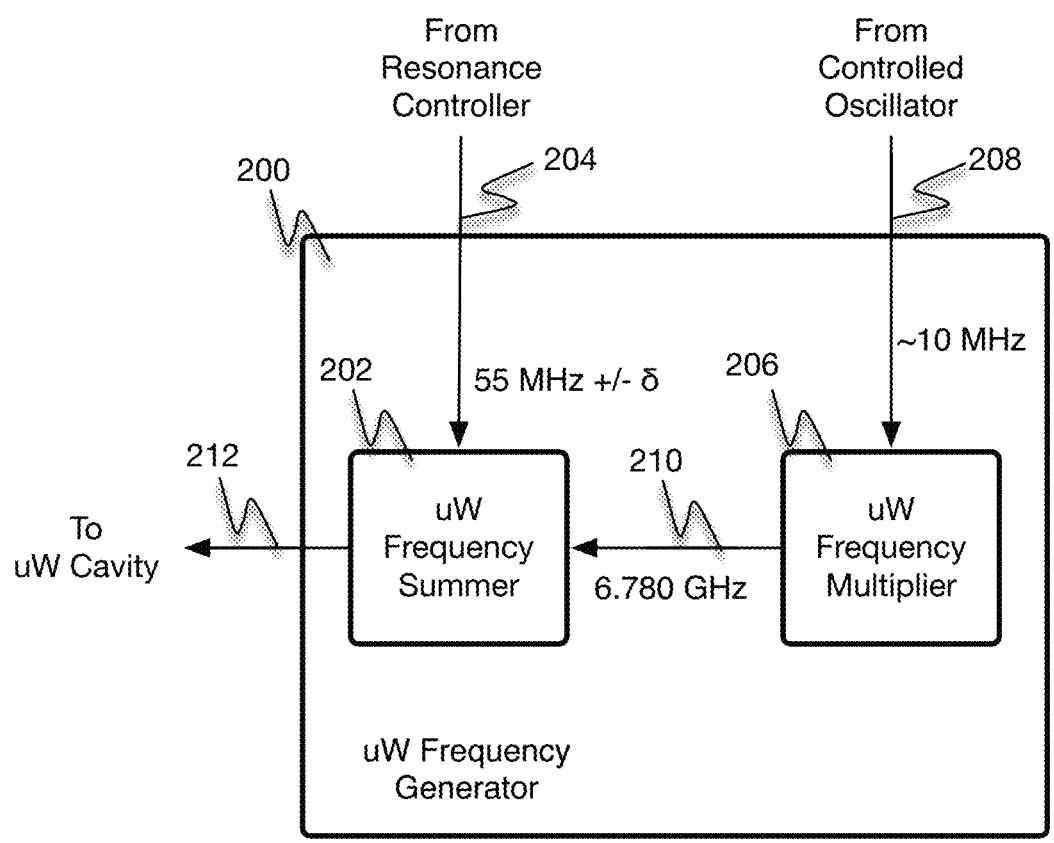
FIG. 2 is a block diagram illustrating an embodiment of a microwave (uW) frequency generator.

FIG. 2 is a block diagram illustrating an embodiment of a microwave (uW) frequency generator. In some embodiments, uW frequency generator 124 of FIG. 1 is implemented using uW frequency generator 200 of FIG. 2. In the example shown, uW frequency generator 200 receives input 204 from resonance controller and input 208 from controlled oscillator, and outputs uW frequency signal 212. In some embodiments, input 204 from resonance controller is a tone (e.g., a 55 MHz+/−delta tone) that is summed by uW frequency summer 202 with a signal generated by microwave (uW) frequency multiplier 206 (e.g., a ~6.780 GHz signal). Resonance controller processes a balanced photodiode signal measured at +delta and at −delta frequencies to determine a photodiode signal difference. The difference signal is then used to steer the frequency received at input 208 (at approximately 10 MHz) from controlled oscillator such that the 6.780 GHz tone from uW frequency multiplier 206 results in maximizing atomic resonance in a uW cavity when added to the resonance controller input 204 (e.g., a 55 MHz+/−delta tone).

Figure 3:
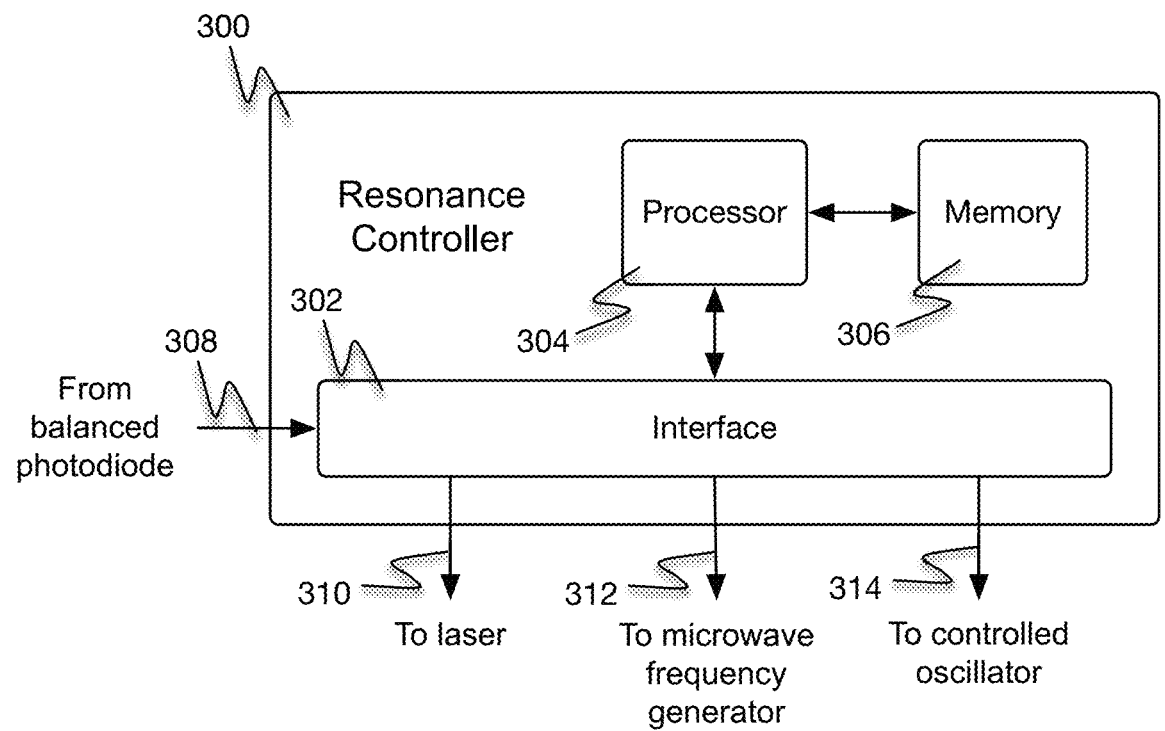
FIG. 3 is a block diagram illustrating an embodiment of a resonance controller.

FIG. 3 is a block diagram illustrating an embodiment of a resonance controller. In some embodiments, resonance controller 106 of FIG. 1 is implemented using resonance controller 300. In the example shown, controller 300 comprises processor 304, memory 306, and interface 302. Resonance controller 300 receives input 308 from balanced photodiode 308 and outputs laser control signal 310 to laser, control signal 312 to microwave frequency generator, and control signal 314 to controlled oscillator. In some embodiments, controller 300 outputs a control signal to the controlled oscillator, whose output is a 10 MHz signal. In various embodiments, output 314 is an analog control voltage that steers a voltage controlled crystal oscillator, a digital transmission telling the controlled oscillator to change its output frequency, or any other appropriate signal. Processor 304 executes a laser control sequence stored in memory 306 that enables measurement of the atoms or molecules in the device using a balanced photodiode. Processor 304 receives photodiode measurements 308 via interface 302 and computes a control signal (control signal 314) for controlled oscillator such that atomic resonance in uW cavity is maximized. A controlled oscillator is controlled using control signal 314. The controlled oscillator is synchronized to the atomic reference when the atomic resonance in uW cavity is optimized.

Figure 4A:
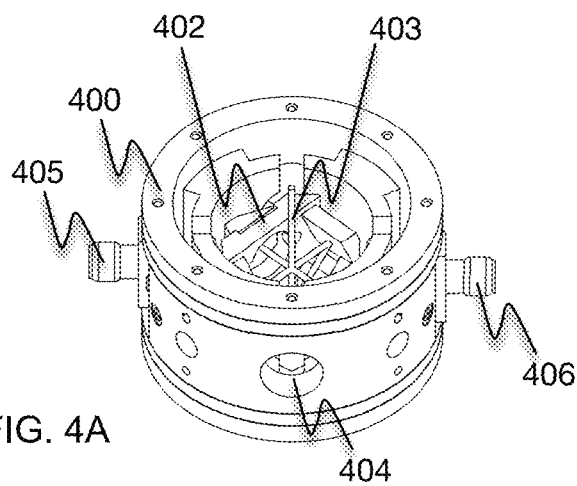
FIGS. 4A-D are diagrams illustrating embodiments of 3D renderings of a microwave (uW) cavity design and internal opto-mechanical assembly for a 3D optical cooling region.

FIGS. 4A-D are diagrams illustrating embodiments of 3D renderings of a microwave (uW) cavity design and internal opto-mechanical assembly for a 3D optical cooling region. FIG. 4A is a diagram illustrating an embodiment of a 3D rendering of a uW cavity design showing the full assembly with outer microwave cavity body 400, internal opto-mechanical assembly 402, and light beam path 403 visible through an upper port. Microwave power from uW frequency generator is input to the cavity by two coaxial feeds via connector 405 and connector 406 located at the cavity mid-plane. In some embodiments, the cavity resonance frequency can be fine-tuned by adjusting the insertion of an upper endcap (not shown) that covers the opening at the top of outer microwave cavity body 400. The upper endcap includes a transparent port enabling light to enter microwave cavity body 400 to follow light beam path 403. Microwave cavity body 400 is enclosed within a larger vacuum chamber (also not shown) as it is not hermetically sealed. In some embodiments, microwave cavity body 400 and the vacuum chamber are combined into one component. Connector 405 and connector 406 terminate in two tiny wire loops (not visible) which generate electro-magnetic fields at microwave frequencies. In some embodiments, the optics and their support structure are fused silica, which exhibit low dielectric loss. The atomic beam from the 2D OCR (not shown) enters the cavity through port 404.

Figure 4B:
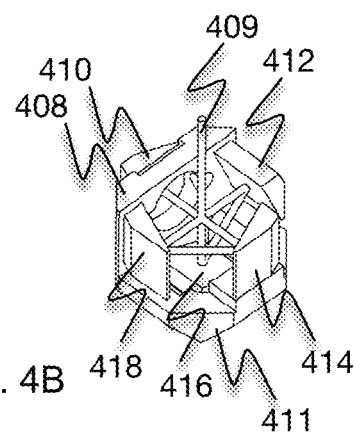

FIG. 4B is a diagram illustrating an embodiment of a 3D rendering of an internal opto-mechanical assembly and beam path. In the example shown, the internal opto-mechanical assembly and beam path are shown with outer microwave cavity body 400 removed. Incoming light beam 409 from above propagates along the −z direction and reflects off mirror 416. The beam is then diverted toward mirror 412, which reflects it along the +x direction toward mirror 418. Mirror 418 reflects the beam toward mirror 414, which diverts the beam along the −y direction toward mirror 410. The beam strikes mirror 410 at normal incidence and is retro-reflected along the same path, ultimately leaving the racetrack along the +z direction. The 3D OCR is defined by the overlap among the beams traveling along the ±x, ±y, and ±z directions. In some cases, polarization-modifying optics such as waveplates are inserted in the 3D OCR optical path to change the polarization of the counter-propagating beams along one or more axes of the 3D OCR. Mirror 416, mirror 412, mirror 414, mirror 418, and 410 are cemented to optical alignment baseplate 408. Mirror 414 is cemented to baseplate 411, which is also cemented to baseplate 408.

Figure 4C:
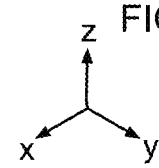
Figure 4C:
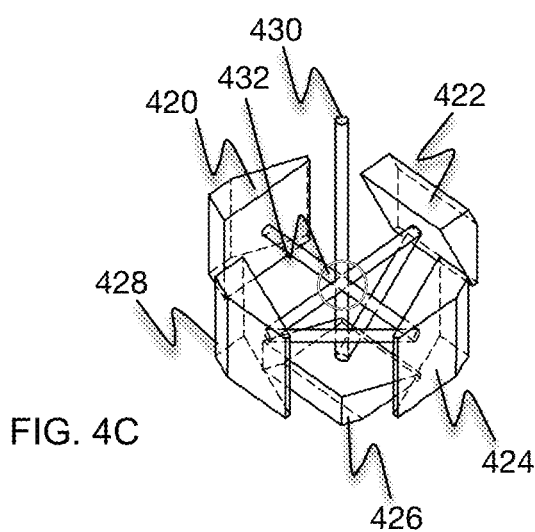

FIG. 4C is a diagram illustrating an embodiment of a zoom of an optical beam path and 3D OCR racetrack. In some embodiments, optical beam path 430 and 3D OCR racetrack of FIG. 4C correspond to optical beam 409 and 3D OCR racetrack of FIG. 4B without baseplate 408 and baseplate 411. In the example shown, the 3D OCR is defined by the overlap among the beams traveling along the ±x, ±y, and ±z directions, and the atom cloud is shown as a circle 432. In some embodiments, mirror 420, mirror 422, mirror 424, mirror 426, and mirror 428 are identically shaped.

Figure 4D:
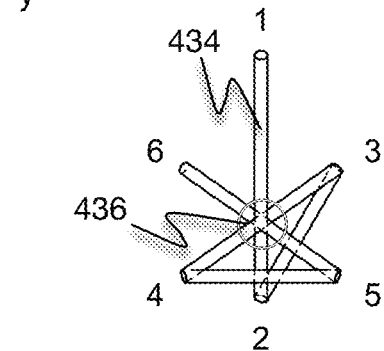

FIG. 4D is a diagram illustrating an embodiment of a zoom of an optical beam path. In some embodiments, optical beam path 434 of FIG. 4D is a zoom of the light path 430 of FIG. 4C. The numbers 1, 2, 3, 4, 5, and 6 indicate the route the light takes coming into the 3D optical racetrack and retraces on the way out of the 3D optical racetrack. Region 436 indicates the atomic cloud region within the 3D OCR.

Figure 5:
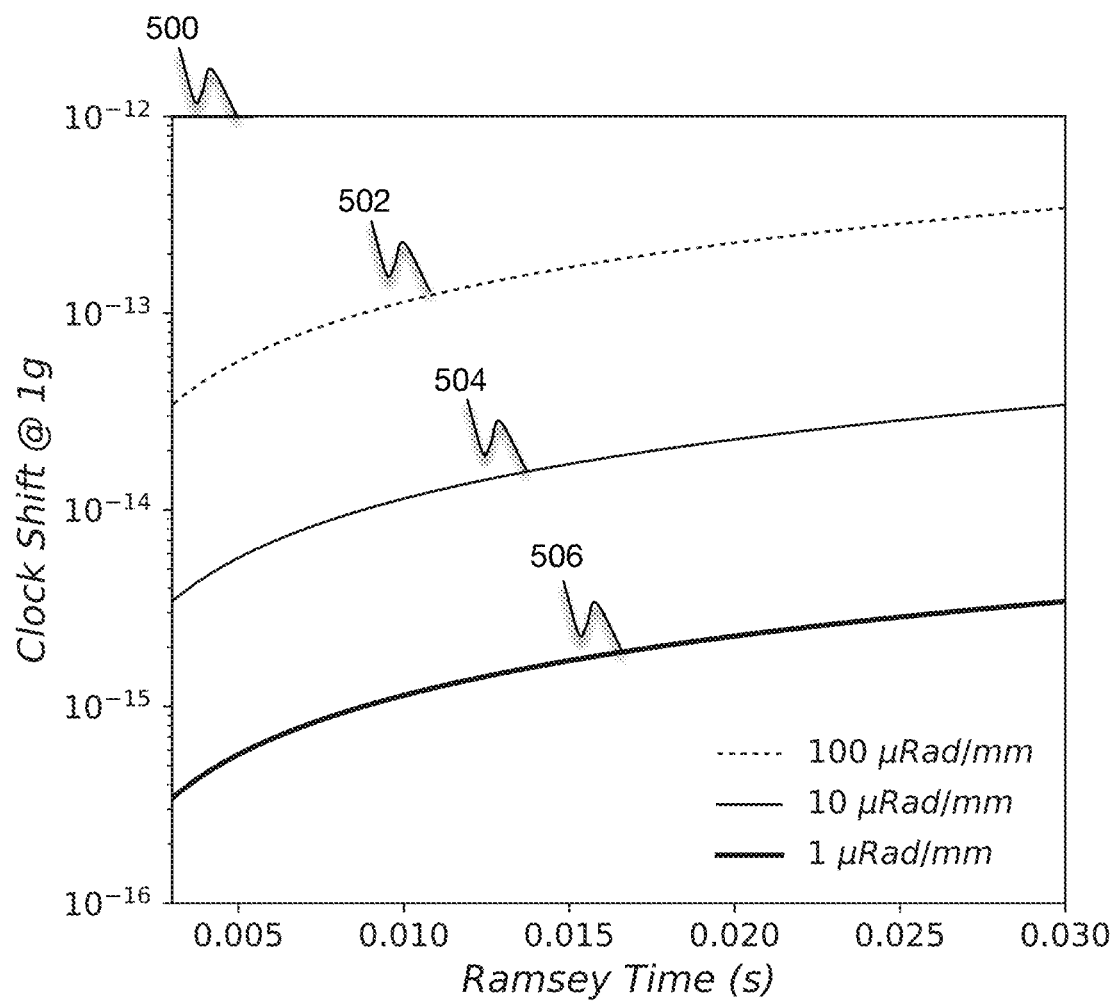
FIG. 5 is a plot illustrating an embodiment of expected fractional clock shifts for different cavity phase gradients as a function of Ramsey interrogation time under 1 g of acceleration.

FIG. 5 is a plot illustrating an embodiment of expected fractional clock shifts for different cavity phase gradients as a function of Ramsey interrogation time under 1 g of acceleration. In the example shown, plot 500 includes curve 502, curve 504, and curve 506. Curve 502 is a plot of clock shift for a phase gradient of 100 uRad/mm. Curve 504 is a plot of clock shift for a phase gradient of 10 uRad/mm. Curve 506 is a plot of clock shift for a phase gradient of 1 uRad/mm. Full inversion of the clock would yield twice the shift. Since the atom displacement under acceleration scales as the square of the Ramsey time, the clock shift for a given phase gradient decreases as time T is reduced. The results indicate that careful cavity design and operation with short Ramsey sequences can minimize the orientation dependence of the cavity phase shift.

Figure 6:
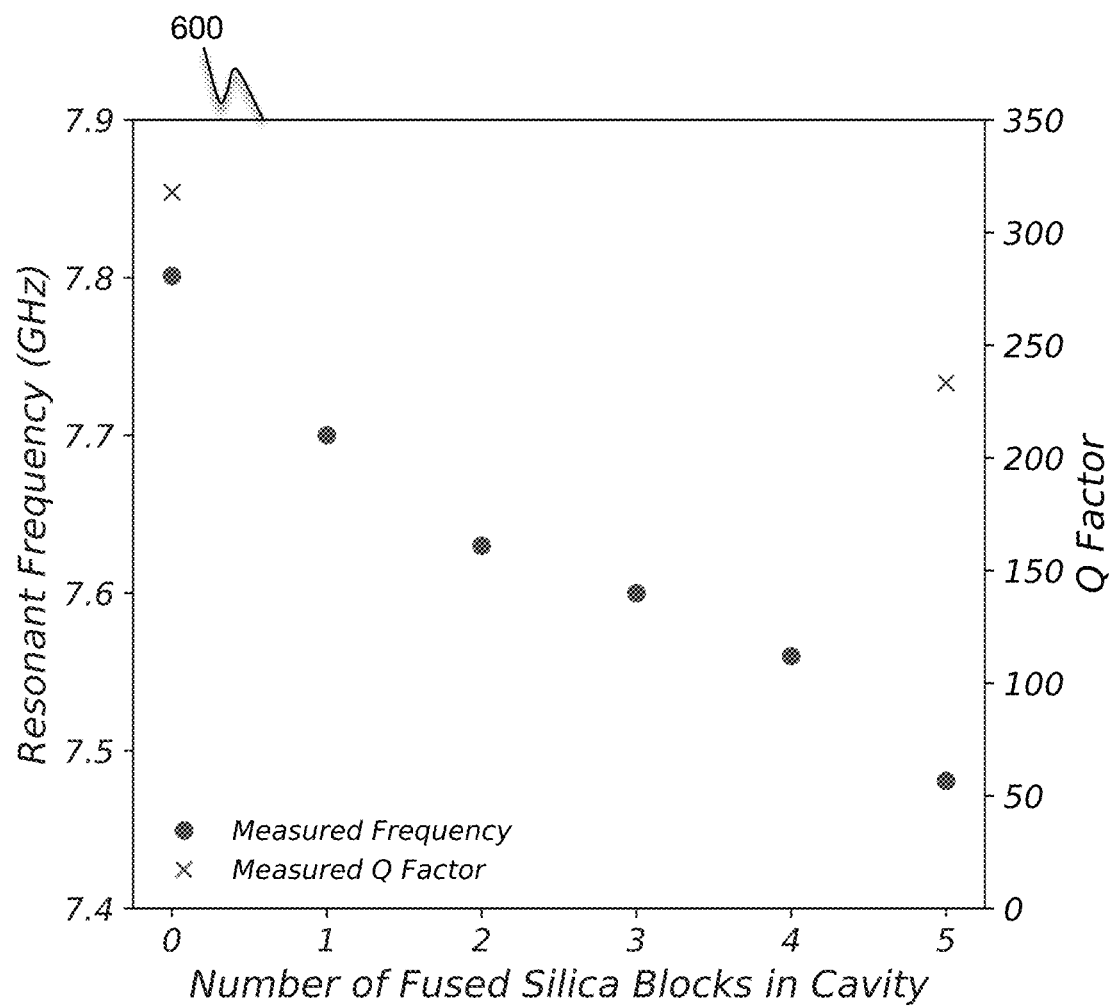
FIG. 6 is a plot illustrating an embodiment of the cavity resonant frequency in GHz and Q-factor as a function of the number of fused silica glass blocks inserted inside the cavity.

FIG. 6 is a plot illustrating an embodiment of the cavity resonant frequency in GHz and resonance quality factor (Q-factor) as a function of the number of fused silica glass blocks inserted inside the cavity. In the example shown, structures that support the glass also shift the cavity resonance. Fused silica mirrors are used for manipulating laser cooling light. In some embodiments, any other suitable optical material may be used. The cavity resonance may be tuned to hit the desired resonance through a combination of modeling, experimental determination, and incremental adjustments.

Figure 7:
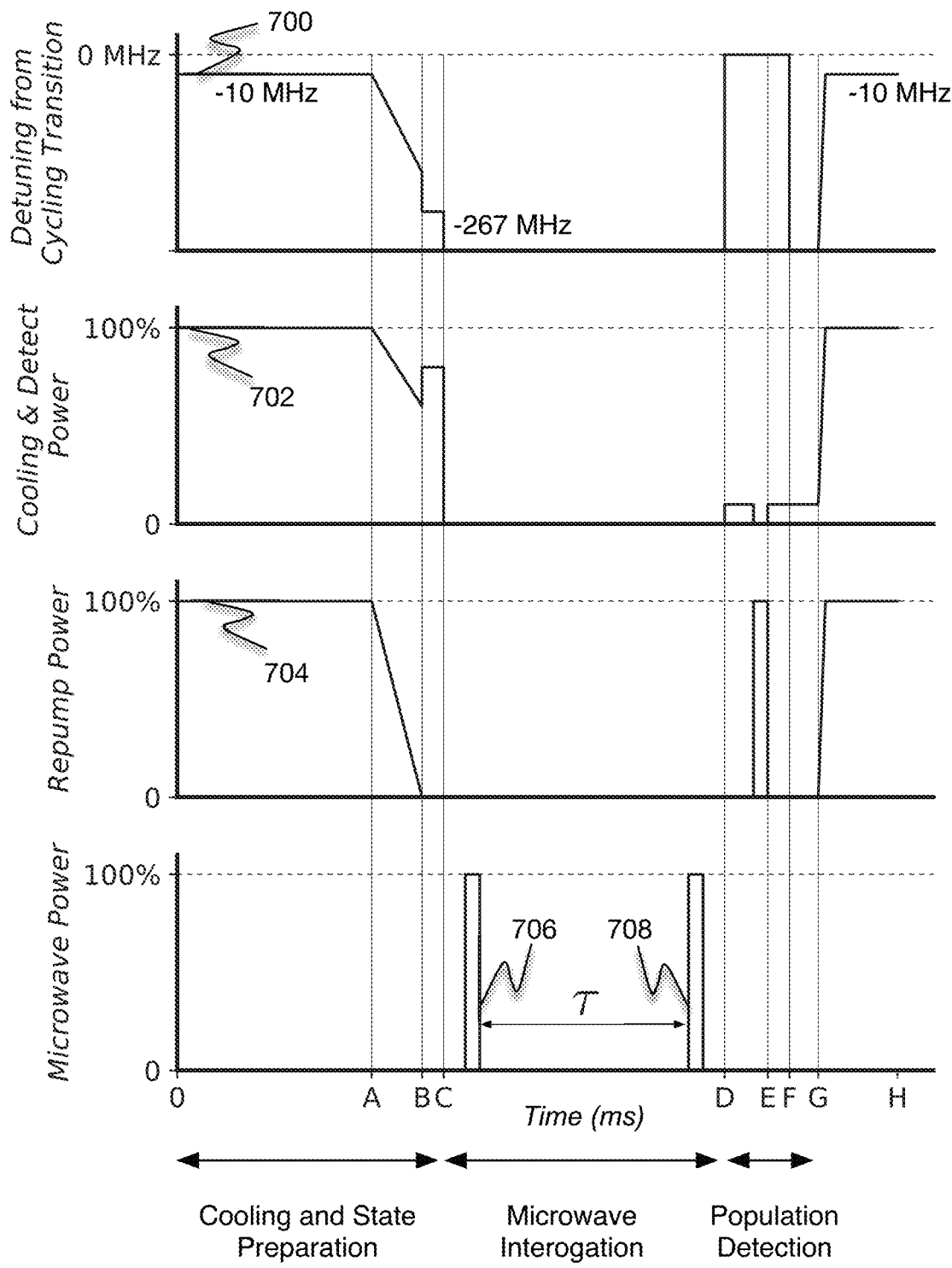
FIG. 7 is a plot illustrating an embodiment of a laser and microwave temporal control sequence implemented by a resonance controller.

FIG. 7 is a plot illustrating an embodiment of a laser and microwave temporal control sequence implemented by a resonance controller. In some embodiments, the control sequence shown in FIG. 7 is executed by resonance controller 106 of FIG. 1 in order to synchronize the frequency of controlled oscillator 116 to an atomic reference. In the example shown, cooling lasers are illuminated at full intensity (702 and 704) for a first time period-time 0 to time A (e.g., a time period of ~18 ms during a load/cool phase). The lasers are then ramped down in intensity and further detuned during a second time period-time A to time B (e.g., a time period of ~4 ms polarization gradient cooling (PGC) phase). An optical pumping pulse during a third time period-time B to time C (e.g., a time period of ~2 ms)-creates a hyperfine population imbalance in preparation for a fourth time period-time C to time D (e.g., a time period of ~22 ms) that is a Ramsey microwave interrogation period, during which time the laser transmission to the 2D and 3D OCR is interrupted. The sequence ends with a set of detection periods (e.g., a period of ~3 ms for the first two detect pulses and of ~1 ms for a third detect pulse), comprising a sequence of weak (~50 µW) optical pulses; absorption of these pulses indicates the final atom state populations that indicate the degree to which the uW frequency generator is in resonance with atomic reference. The overall timing sequence is repeated (e.g., at a rate of ~20 Hz).

In a first time period from time 0 to time A (~25 ms), the laser cools and traps atoms. For example, the cooling light is red-detuned from the cycling transition and on at full power. The re-pump light is on resonance with the re-pump transition and on at full power. Microwave power is off. The cooling light is slightly red-detuned from the strongest 87Rb optical absorption line (the F=2 ground state to the F'=3 excited state), since only atoms moving toward the beam will absorb the light and be slowed. The re-pump beam prevents the atoms from being trapped in the F=1 ground state.

In a second time period from time A to time B (~5 ms), the laser implements polarization gradient cooling. For example, the cooling light is further red-detuned while its intensity is turned down. The re-pump beam is turned off toward the end of this step for optical pumping. This sequence results in a lower temperature for the atom cloud.

In a third time period from time B to time C (~1 ms), the laser implements optical pumping. For example, the cooling light is detuned to −266.65 MHz and on at intermediate power. Re-pump light is off. Microwave power is off. The cooling light detuning is chosen to pump atoms from the F=2 ground state to the F'=2 excited state, from which they fall back into the F=1 ground state.

In a fourth time period from time C to time D (~25 ms), the laser implements microwave interrogation of the state of the atom cloud. For example, the cooling and re-pump light intensities are fully attenuated. To mitigate the influence of any residual light leakage, the cooling light is also detuned from resonance. Microwave pulses 706 and microwave pulse 708 occur with time separation τ. The microwave pulses excite the 6.835 GHz transition between the F=1 and F=2 ground states in a Ramsey sequence. If the microwave frequency is in resonance with the atomic transition frequency, all atoms will end up in the F=2 ground state at the end of the dark fourth time period. The atom cooling/trapping beams are off.

In a fifth time period from time D to time E (~2 ms), the laser implements a first detection window. For example, the cooling light is tuned on the cycling transition frequency at very low intensity (well below the optical transition saturation intensity). Re-pump light is off. The balanced photodetector signal is recorded, yielding a comparison of the optical power in the signal and reference beams. The difference in these two powers indicates absorption by atoms in the F=2 ground state but is insensitive to atoms in the F=1 ground state, so this signal is a proxy for the number of atoms in the F=2 ground state. Because the cooling light is tuned to the cycling transition, it does not substantially depopulate the atoms in the F=2 ground state. At the end of this time window, the cooling light is briefly turned off and the re-pump light turned on at high power. The re-pump light depopulates the atoms from the F=1 ground state into the F=2 ground state via the F'=2 excited state while having minimal impact on the atoms previously in the F=2 ground state.

In a sixth time period from time E to time F (~2 ms), the laser implements a second detection window. For example, the cooling light is tuned to the cycling transition at very weak power. Re-pump light is off. The balanced photodetector signal is recorded. Because all the atoms are in the F=2 ground state, the absorption signal is a proxy for the total atomic signal, indicating the total atom number summed over all ground states.

In a seventh time period from time F to time G (~2 ms), the laser implements a third detection window. For example, the cooling light is tuned far off resonance at very weak power. Re-pump light is off. The balanced photodetector signal is recorded. Because an off-resonance beam isn't absorbed by the atoms, this allows measurement of the nominal beam power.

In an eighth time period from time G to time H (~1 ms), the laser implements atom recapture. For example, the cooling light is red-detuned from the cycling transition and on at full power. The re-pump light is on resonance with the re-pump transition and on at full power. The timing sequence is reset to cool and trap the atoms remaining in the cloud. This puts the system back in the initial atom cooling & trapping state, and the clock cycle starts over anew.

Figure 8:
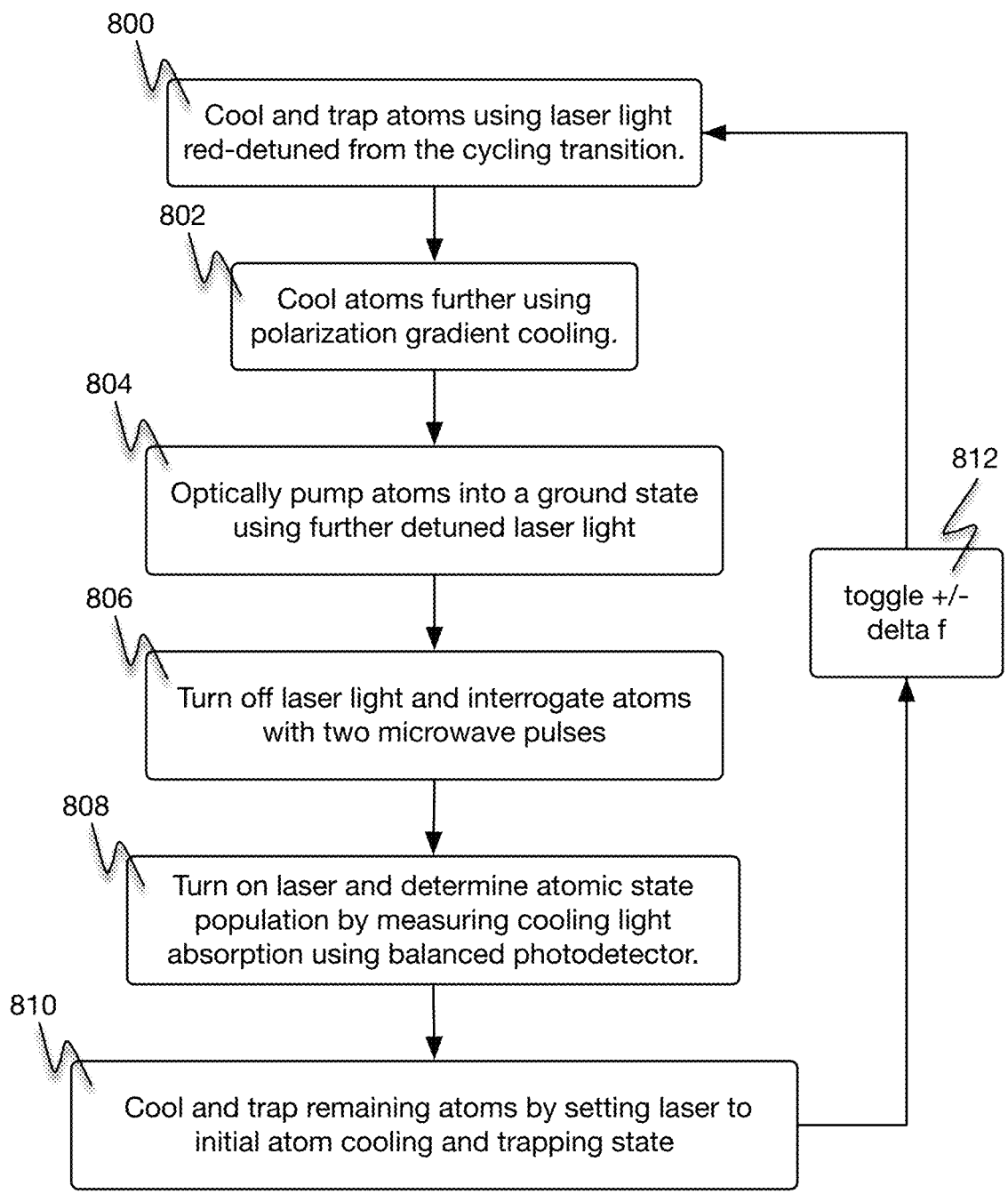
FIG. 8 is a flow diagram illustrating an embodiment of a temporal control sequence for compact cold atom clocks.

FIG. 8 is a flow diagram illustrating an embodiment of a temporal control sequence for compact cold atom clocks. In some embodiments FIG. 8 is a flow diagram for the temporal control sequence of FIG. 7. In the example shown, in 800, atoms are cooled and trapped using laser light red-detuned from the cycling transition. For example, cooling light is slightly red-detuned from the strongest optical absorption line (the F=2 ground state to the F'=3 excited state), since only atoms moving toward the beam will absorb the light and be slowed. The re-pump beam prevents the atoms from being trapped in the F=1 ground state. In 802, atoms are further cooled using polarization gradient cooling. For example, the cooling light is further red-detuned while its intensity is turned down. In 804, atoms are optically pumped into a ground state using further detuned laser light. For example, the cooling light is detuned to −266.65 MHz and on at intermediate power. The cooling light detuning is chosen to pump atoms from the F=2 ground state to the F'=2 excited state, from which they fall back into the F=1 ground state. In 806, laser light turned off and two microwave pulses are used to interrogate atoms. For example, the cooling and re-pump light intensities are fully attenuated. The microwave pulses excite the 6.835 GHz transition between the F=1 and F=2 ground states in a Ramsey sequence. If the microwave frequency is in resonance with the atomic transition frequency, all atoms will end up in the F=2 ground state. In 808, the laser is turned on and atomic state population is determined by measuring cooling light absorption using balanced photodetector. For example, the cooling light is tuned to the cycling transition at very weak power and the balanced photodetector signal is recorded. Because all the atoms are in the F=2 ground state, the absorption signal is a proxy for the total atomic signal. In 810, the remaining atoms are cooled and trapped by setting laser to initial atom cooling and trapping state. For example, the cooling light is red-detuned from the cycling transition and on at full power. The re-pump light is on resonance with the re-pump transition and on at full power. The timing sequence is reset to cool and trap the atoms remaining in the cloud. This puts the system back in the initial atom cooling & trapping state, and the clock cycle starts over anew. In 812, +/−delta f is toggled. For example, the frequency driving the uW frequency summer is toggled between 55 MHz+delta and 55 MHz−delta. The difference between the balanced photodiode measurement at +delta and −delta is minimized by a resonance controller. Minimizing the +/−delta difference ensures that the mean value of these two frequencies is resonant with the atomic microwave transition.

Figure 9:
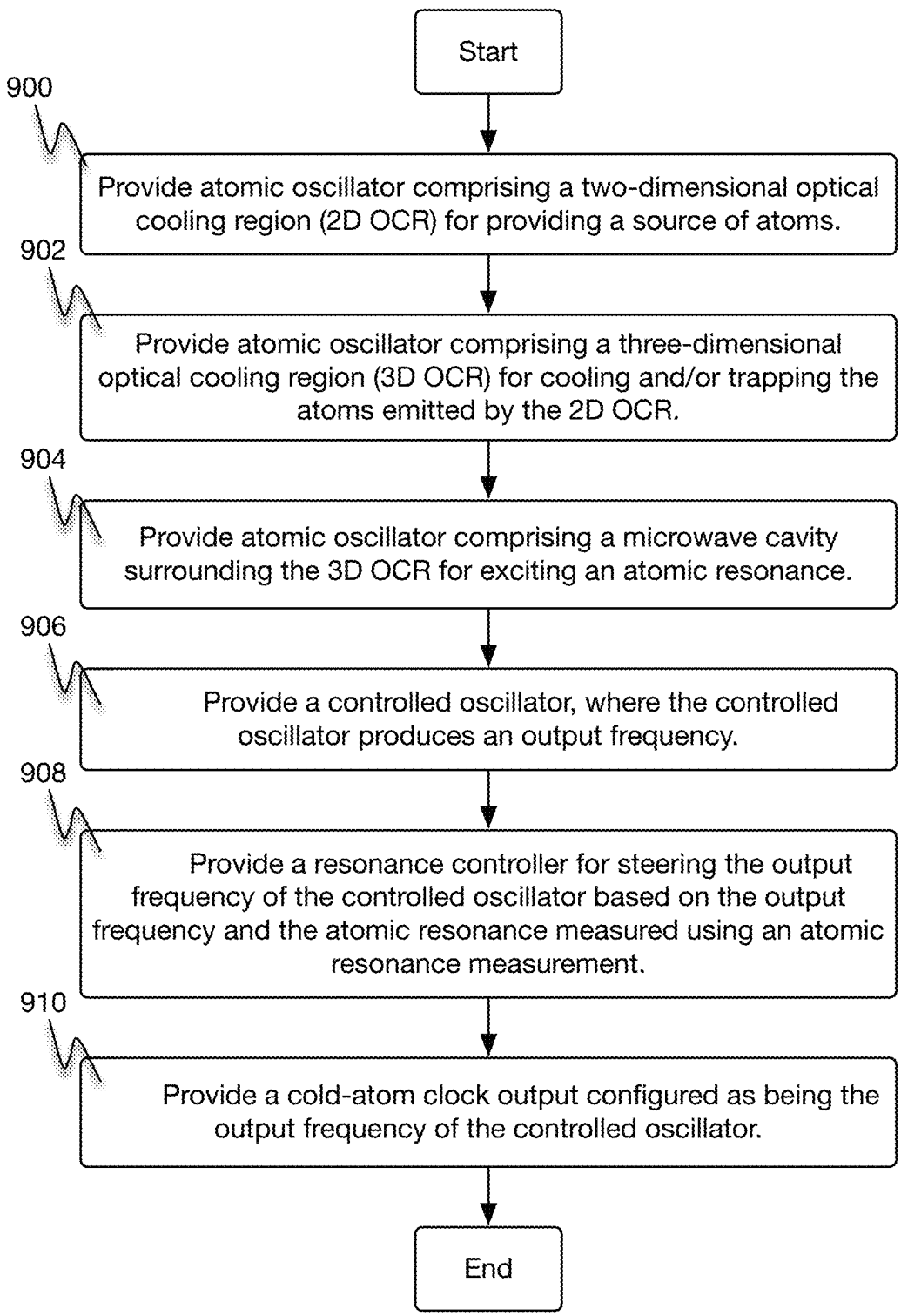
FIG. 9 is a flow diagram illustrating an embodiment of a process for compact cold atom clocks.

FIG. 9 is a flow diagram illustrating an embodiment of a process for compact cold atom clocks. In some embodiments, the process of FIG. 9 is executed using cold atom clock architecture 100 of FIG. 1. In the example shown, in 900, atomic oscillator comprising a two-dimensional optical cooling region (2D OCR) for providing a source of atoms is provided. In 902, atomic oscillator comprising a three-dimensional optical cooling region (3D OCR) for cooling and/or trapping the atoms emitted by the 2D OCR is provided. In 904, atomic oscillator comprising a microwave cavity surrounding the 3D OCR for exciting an atomic resonance is provided. In 906, a controlled oscillator is provided, where the controlled oscillator produces an output frequency. In 908, a resonance controller is provided for steering the output frequency of the controlled oscillator based on the output frequency and the atomic resonance measured using an atomic resonance measurement. In 910, a cold-atom clock output configured as being the output frequency of the controlled oscillator is provided.

Although the foregoing embodiments have been described in some detail for purposes of clarity of understanding, the invention is not limited to the details provided.

There are many alternative ways of implementing the invention. The disclosed embodiments are illustrative and not restrictive.

What is claimed is:

1. A device, comprising:
   a single laser;
   an atomic oscillator, wherein the atomic oscillator comprises:
      a two-dimensional optical cooling region (2D OCR) for providing a source of atoms, wherein the single laser is used to generate 2D OCR laser beams;
      a three-dimensional optical cooling region (3D OCR) for cooling and/or trapping the atoms emitted by the 2D OCR, wherein the single laser is used to generate 3D OCR laser beams; and
      a microwave cavity surrounding the 3D OCR for exciting an atomic resonance; and
   a controlled oscillator, wherein the controlled oscillator produces an output frequency;
   a resonance controller for steering the output frequency of the controlled oscillator based on the output frequency and the atomic resonance as measured using an atomic resonance measurement; and
   a cold-atom clock output configured as being the output frequency of the controlled oscillator.

2. The device as in claim 1, further comprising a multilayer magnetic shield surrounding the microwave cavity for separating the 3D OCR from strong magnetic fields of the 2D OCR.

3. The device of claim 1, wherein the controlled oscillator comprises a microwave generator.

4. The device of claim 1, wherein the resonance controller is used to control the laser for a temporal sequence including state preparation, atom cooling, and measurement.

5. The device of claim 1, wherein the 2D OCR comprises a two-dimensional optical molasses (2D OM).

6. The device of claim 1, wherein the 2D OCR comprises a two-dimensional magneto-optical trap (2D MOT).

7. The device of claim 1, wherein the 3D OCR comprises a three-dimensional optical molasses (3D OM).

8. The device of claim 7, wherein the 3D OCR comprises a three-dimensional magneto-optical trap (3D MOT).

9. The device of claim 1, wherein the 2D OCR, the 3D OCR, and the microwave cavity are in vacuum.

10. The device of claim 1, wherein the microwave cavity is surrounded by magnetic shielding, also in vacuum.

11. The device of claim 1, wherein the microwave cavity is a loop-gap resonator (LGR) cavity.

12. The device of claim 11, wherein the LGR cavity has multiple microwave feeds for improved homogeneity of a microwave field phase and/or a microwave field amplitude.

13. The device of claim 1, wherein a microwave cavity resonant frequency of the microwave cavity is tuned by adjusting a cavity end cap thickness.

14. The device of claim 1, wherein the 2D OCR laser beams are generated by a laser beam from the single laser entering the 2D OCR and the laser beam is routed in an optical racetrack configuration, wherein the optical racetrack configuration enables an incoming beam to retrace its path without lateral displacement.

15. The device of claim 1, wherein the single laser comprises a two-tone laser with laser detuning and intensity control.

16. The device of claim 1, wherein the single laser generates a laser beam transmitted to the atomic oscillator.

17. The device of claim 1, wherein the 3D OCR laser beams are generated by a laser beam from the single laser routed in an optical racetrack configuration, wherein the optical racetrack configuration enables an incoming beam to retrace its path without lateral displacement.

18. The device of claim 17, wherein the 3D OCR laser beams are used for absorptive detection of a number of atoms in a particular atomic state.

19. The device of claim 17, wherein optics comprising the optical racetrack configuration are enclosed within the microwave cavity.

20. The device of claim 17, wherein the laser beam is sent into the 3D OCR via a polarizing beamsplitter, and wherein polarization optics within the 3D OCR rotate a polarization of a returning beam by approximately 90 degrees.

21. The device of claim 1, wherein permanent magnets are used to generate magnetic fields in the 2D OCR and/or the 3D OCR.

22. The device of claim 1, wherein a series of adjacent beamsplitter cubes is used to divert laser light with an elongated beam shape toward the 2D OCR.

23. A method for a cold atom clock, comprising:
   providing an atomic oscillator, wherein the atomic oscillator comprises:
      a two-dimensional optical cooling region (2D OCR) for providing a source of atoms, wherein a single laser is used to generate 2D OCR laser beams;
      a three-dimensional optical cooling region (3D OCR) for cooling and/or trapping the atoms emitted by the 2D OCR, wherein the single laser is used to generate 3D OCR laser beams; and
      a microwave cavity surrounding the 3D OCR for exciting an atomic resonance; and
   providing a controlled oscillator, wherein the controlled oscillator produces an output frequency;
   providing a resonance controller for steering the output frequency of the controlled oscillator based on the output frequency and the atomic resonance as measured using an atomic resonance measurement; and
   providing a cold-atom clock output configured as being the output frequency of the controlled oscillator.

* * * * *